(12) United States Patent
Louie et al.

(10) Patent No.: US 7,213,188 B2
(45) Date of Patent: May 1, 2007

(54) ACCESSING TEST MODES USING COMMAND SEQUENCES

(75) Inventors: Benjamin Louie, Fremont, CA (US); Judy Wan, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 256 days.

(21) Appl. No.: 10/930,153

(22) Filed: Aug. 31, 2004

(65) Prior Publication Data

US 2006/0048033 A1    Mar. 2, 2006

(51) Int. Cl.
*G01R 31/28*    (2006.01)
(52) U.S. Cl. ........................ 714/742; 714/724
(58) Field of Classification Search ................ 714/742, 714/724, 718, 721; 365/201
See application file for complete search history.

(56) References Cited

U.S. PATENT DOCUMENTS

| 5,526,311 | A |   | 6/1996 | Kreifels |
|---|---|---|---|---|
| 5,703,512 | A | * | 12/1997 | McClure ..................... 327/198 |
| 5,706,232 | A | * | 1/1998 | McClure et al. ............ 365/201 |
| 6,404,250 | B1 |  | 6/2002 | Volrath |
| 6,717,292 | B2 | * | 4/2004 | Youssef et al. ............... 307/64 |
| 6,791,373 | B2 | * | 9/2004 | Oyama ........................ 327/78 |

* cited by examiner

*Primary Examiner*—James C Kerveros
(74) *Attorney, Agent, or Firm*—Leffert Jay & Polglaze, P.A.

(57) ABSTRACT

An integrated circuit device receives a sequence of commands and enables a test mode of the integrated circuit device in response to the command sequence when all of the commands of the sequence are correct. The integrated circuit device disables the test mode upon receiving an incorrect command of the sequence.

23 Claims, 2 Drawing Sheets

ACCESSING TEST MODES USING COMMAND SEQUENCES

TECHNICAL FIELD OF THE INVENTION

The present invention relates generally to integrated circuit devices and in particular the present invention relates to accessing test modes using command sequences.

BACKGROUND OF THE INVENTION

Memory devices, such as a NAND or a NOR flash memory devices, dynamic random access memory devices (DRAMs), static random access memory device (SRAMs), or the like, are generally fabricated on semiconductor wafers. Each of these wafers typically contains a number of individual integrated circuit memory devices formed in rectangular areas known as dies. After fabrication, each die is separated, or diced, then packaged in a format suitable for the end user.

Before or after dicing and packaging, a manufacturer may test its integrated circuit devices as part of a quality program to improve end-use reliability. Such tests are generally performed on highly-specialized testing systems or tester hardware. Prior to dicing, tests may be performed by the testing system on each die of a semiconductor wafer in pattern. The tester hardware may test each die individually or it may test multiple dies concurrently. Subsequent to dicing, tests may be performed by the testing system on multiple packaged components in pattern. The tester hardware may test each component individually or it may test multiple components concurrently.

Testing is usually performed by placing the memory device in a test mode that is different from the normal operating mode. Test modes often enable one or more registers to be accessed that are not accessible during normal operation. A high voltage is often applied to a memory device to place the memory device into a test mode. This voltage is typically greater than the normal operating voltage, e.g., approximately 50 to 100 percent greater than the normal operating voltage, supplied to the memory device. The memory device is configured to enter the test mode in response to receiving the high voltage signal.

High voltages are often used for accessing a test mode to prevent unauthorized personnel, such as intermediate and end users, from accessing the test mode, because many unauthorized personnel do not have such high voltages available to the memory device as installed. Moreover, using high voltages for accessing a test mode prevents memory devices from being inadvertently placed in the test mode during normal operation. However, for some applications, it may be desirable to place the memory device into test mode when there are no high voltages available. Therefore, low-voltage access methods have been proposed. However, low-voltage access methods can make it easier for hackers to hack in to the test mode registers and to alter the intended operation of the memory device.

For the reasons stated above, and for other reasons stated below which will become apparent to those skilled in the art upon reading and understanding the present specification, there is a need in the art for alternatives for accessing test modes of memory devices.

SUMMARY

The above-mentioned problems with accessing test modes of memory devices and other problems are addressed by the present invention and will be understood by reading and studying the following specification.

For one embodiment, the invention provides a method of operating an integrated circuit device that includes receiving a sequence of commands at the integrated circuit device, enabling a test mode of the integrated circuit device in response to the command sequence when all of the commands of the sequence are correct, and disabling the test mode upon receiving an incorrect command of the sequence.

For another embodiment, the invention provides a method of operating a memory device that includes receiving a sequence of commands at the memory device, enabling a test mode of the memory device in response to the command sequence when all of the commands of the sequence are correct, setting a disable latch of the memory device upon receiving an incorrect command to disable the test mode, and requiring a power-on reset to the memory device to reset the latch to its initial state in order to enable the test mode using a subsequent sequence of all correct commands.

Further embodiments of the invention include methods and apparatus of varying scope.

DETAILED DESCRIPTION

Figure 1:
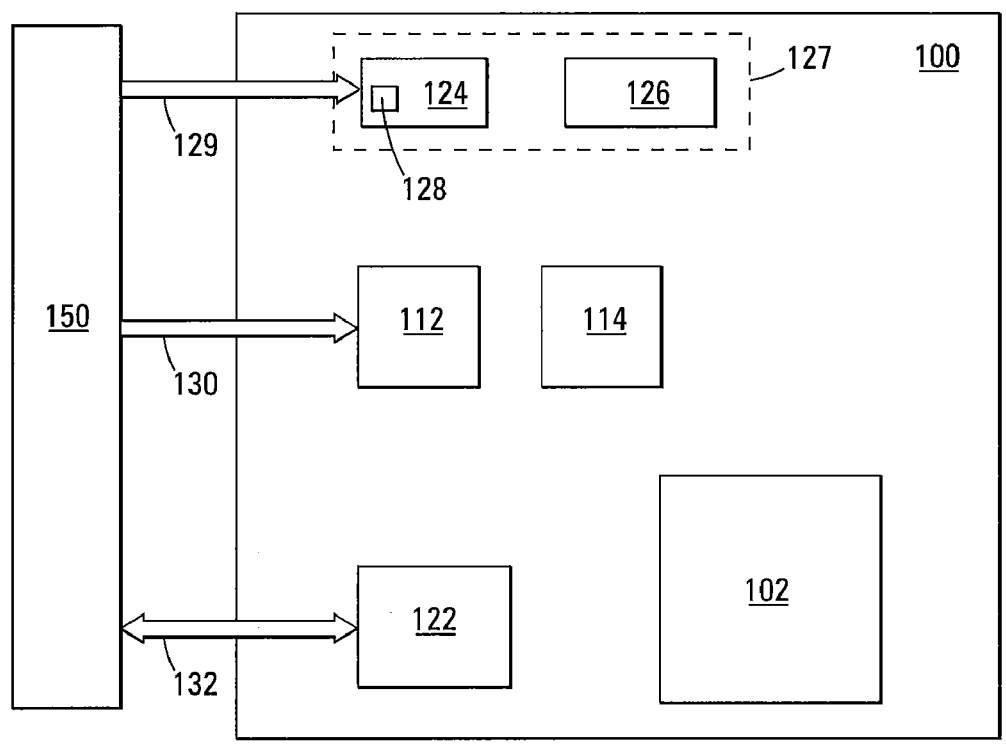
FIG. 1 is a block diagram illustration of a portion of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustration of a portion of an integrated circuit device, such as a processor, a memory device 100, etc., according to an embodiment of the invention. Examples of memory devices include NAND or NOR flash memory devices, dynamic random access memory devices (DRAMs), static random access memory devices (SRAMs), or the like. Memory device 100 includes a memory array 102 having a plurality of memory cells arranged in row and column fashion. For one embodiment, each of the memory cells includes a floating-gate field-effect transistor capable of holding a charge for the non-volatile storage of data. Each of the cells can be electrically programmed on an individual basis by charging the floating gate.

Memory array 102 can be accessed using externally provided location addresses received by an address register 112 via address signal connections 130. The address signals are decoded, and one or more target memory cells are selected in response to the decoded address signals, using access circuitry 114 that includes decode and select circuitry.

Data is input and output through an I/O circuit 122 via data connections 132. I/O circuit 122 includes data output registers, output drivers and output buffers. Command execution logic 124 is provided to control the basic operations of the memory device 100 in response to control signals received via control signal connections 129. A state machine 126 may also be provided to control specific operations performed on the memory array and cells. The command execution logic 124 and/or state machine 126 can be generally referred to as control circuitry 127 to control read, write, erase and other memory operations. The control circuitry 127 is adapted to facilitate the methods of the various embodiments. The data connections 132 are typically used for bi-directional data communication. The memory can be coupled to an external processor 150 as a part of an electronic system for operation or for testing. Examples of a processor 150 include a memory controller in a personal computer and a processor of tester hardware.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

For one embodiment, command state machine 126 receives a sequence of low-voltage commands from processor 150. Command state machine 126 enables a test mode of memory device 100 upon receiving a correct command sequence, e.g., of low-voltage command signals having voltages that are on the order of the normal operating voltages of memory device 100. It will be appreciated that that the present invention is not limited to low-voltage commands. For example, a sequence of high-voltage commands, e.g., voltages greater than the normal operating voltages, or a sequence of high- and low-voltage commands maw be used.

If one or more of the commands of the sequence is incorrect, command state machine 126 sets a disable latch 128, e.g., as a portion of command execution logic 124, to disable the test mode. For one embodiment, disable latch 128 is configured to be reset to its initial state for allowing access to the test mode only in response to memory device 100 being powered down and powered back up, i.e., in response to a power-on reset. This means that when memory device 100 receives an incorrect sequence of commands, memory device 100 would be locked out of its test mode until the power is cycled.

Figure 2:
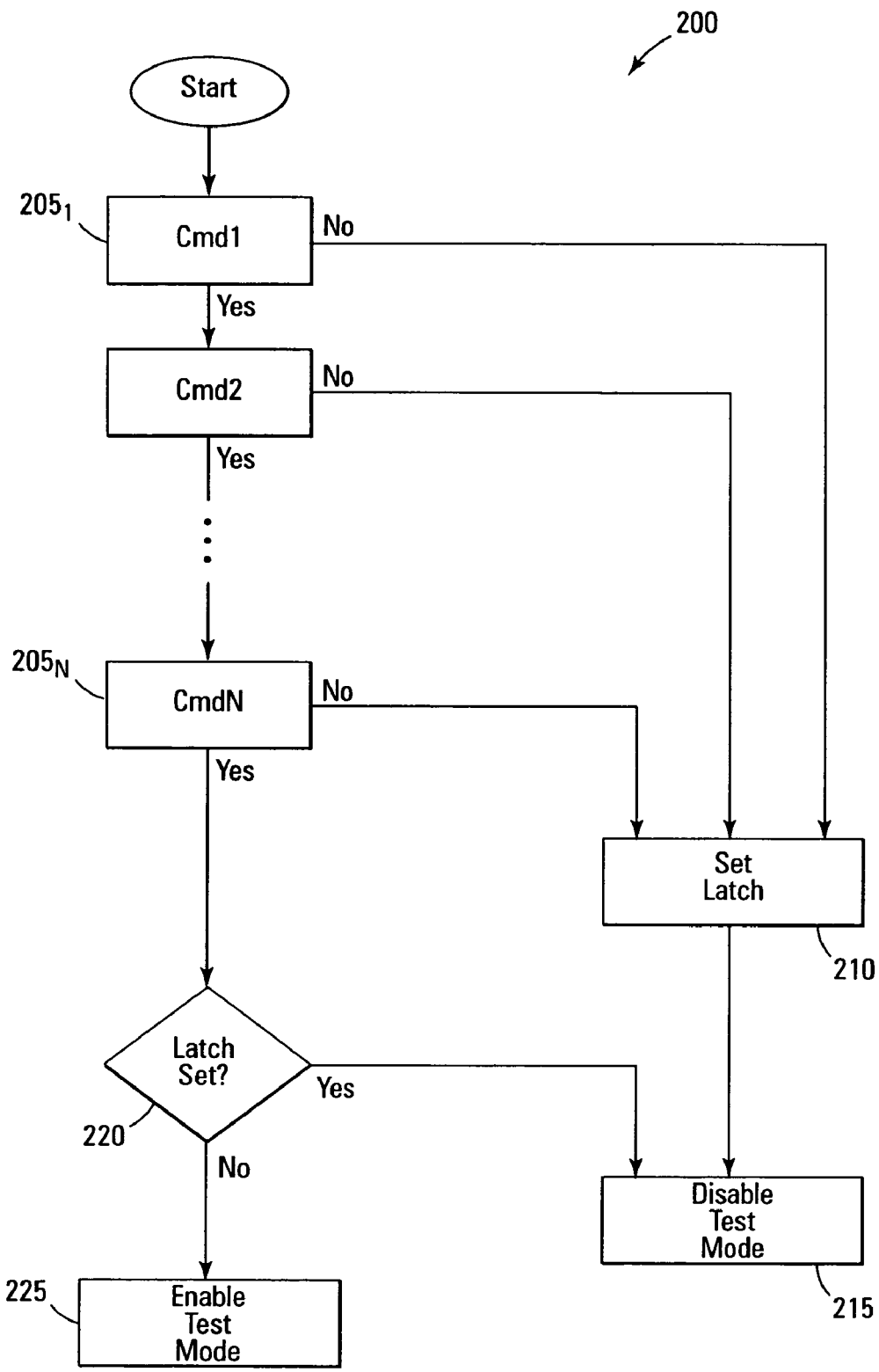
FIG. 2 is a flowchart of a method for accessing a test mode of an integrated circuit device, according to another embodiment of the invention.

FIG. 2 is a flowchart of a method 200, e.g., a low-voltage-command mode (LCVM) of operation, for accessing a test mode of an integrated circuit device, e.g., memory device 100, according to another embodiment of the invention. A first command Cmd1 of a command sequence is received at block $205_1$. At block $205_1$, it is determined whether the first command Cmd1 is correct. For one embodiment, this may be accomplished by comparing the first command Cmd1 to a predetermined command, and when the first command Cmd1 matches the predetermined command, the first command Cmd1 is correct. Otherwise, the first command Cmd1 is incorrect. If the first command Cmd1 is incorrect, disable latch 128 is set at block 210, and the test mode is disabled at block 215.

If the first command Cmd1 is correct, method 200 proceeds to block $205_2$. If a second command Cmd2 is incorrect at block $205_2$, disable latch 128 is set at block 210, and the test mode is disabled at block 215. Otherwise, the method proceeds, as described, to block $205_N$. If an Nth command CmdN is incorrect at block $205_N$, disable latch 128 is set at block 210, and the test mode is disabled at block 215. Otherwise, for one embodiment, the method proceeds to a decision block 220.

At decision block 220, method 200 determines whether disable latch 128 was previously set. If disable latch 128 was previously set, the test mode is disabled at block 215, regardless of whether a correct command sequence is received. Therefore, further command sequences are ignored. Otherwise, the test mode is enabled at block 225.

For another embodiment, decision block 220 may be omitted. For this embodiment, setting disable latch 128 prevents further command sequences from being evaluated until disable latch 128 is reset. When all of the commands are correct, the test mode is enabled at block 225.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating an integrated circuit device, comprising: receiving a sequence of commands at the integrated circuit device;
   enabling a test mode of the integrated circuit device in response to the sequence of commands when all of the commands of the sequence are correct; and
   disabling the test mode upon receiving an incorrect command of the sequence;
   wherein the commands are voltage signals having voltages that are on the order of normal operating voltages of the integrated circuit device.

2. The method of claim 1, wherein disabling the test mode comprises setting a disable latch of the integrated circuit device.

3. The method of claim 1 further comprises ignoring further sequences of commands upon receiving the incorrect command.

4. The method of claim 1 further comprises requiring a power-on reset to the integrated circuit device before enabling the test mode after the incorrect command is received.

5. The method of claim 1, wherein a command is correct when the command matches a predetermined command.

6. A method of operating a memory device, comprising:
   receiving a sequence of commands at the memory device;
   comparing each command to a corresponding predetermined command;
   enabling a test mode of the memory device in response to the sequence of commands when all of the commands of the sequence match their corresponding predetermined commands; and
   disabling the test mode when one command of the sequence does not match its corresponding predetermined command;
   wherein the commands are voltage signals having voltages that are on the order of normal operating voltages of the integrated circuit device.

7. The method of claim 6 further comprises ignoring further sequences of commands when one command does not match its corresponding predetermined command.

8. The method of claim 6 further comprises requiring a power-on reset to the memory device before enabling the test mode when one command does not match its corresponding predetermined command.

9. A method of operating a memory device, comprising:
receiving a sequence of commands at the memory device;
enabling a test mode of the memory device in response to the sequence of commands when all of the commands of the sequence are correct;
setting a disable latch of the memory device upon receiving an incorrect command to disable the test mode; and
requiring the memory device to power down and power back up to reset the latch to its initial state in order to enable the test mode using a subsequent sequence of all correct commands.

10. The method of claim 9, wherein the commands are voltage signals having voltages that are on the order of normal operating voltages of the memory device.

11. The method of claim 9, wherein a command is correct when the command matches a predetermined command.

12. The method of claim 9, wherein receiving a sequence of commands at the memory device comprises receiving the sequence of commands at a command state machine of the memory device.

13. The method of claim 9, wherein the disable latch of the memory device is a portion of command execution logic of the memory device.

14. A memory device comprising:
an array of memory cells; and
control circuitry for controlling operation of the memory device, wherein the control circuitry is configured to cause the memory device to perform a method of operation comprising:
enabling a test mode of the memory device in response to a command sequence when all of the commands of the command sequence are correct; and
disabling the test mode upon receiving an incorrect command of the command sequence;
wherein the commands are voltage signals having voltages that are on the order of normal operating voltages of the integrated circuit device.

15. The memory device of claim 14, wherein, in the method, disabling the test mode comprises setting a disable latch of the control circuitry.

16. The memory device of claim 14, wherein the method further comprises ignoring further command sequences upon receiving the incorrect command.

17. The memory device of claim 14, wherein the method further comprises requiring a power-on reset to the memory device before enabling the test mode after the incorrect command is received.

18. The memory device of claim 14, wherein, in the method, a command is correct when the command matches a predetermined command.

19. A memory device comprising:
an array of memory cells;
control logic comprising a disable latch; and
a command state machine configured to cause the memory device to perform a method of operation comprising:
enabling a test mode of the memory device in response to a sequence of commands when all of the commands of the sequence are correct;
setting the disable latch upon receiving an incorrect command to disable the test mode; and
requiring the memory device to power down and power back up to reset the latch to its initial state in order to enable the test mode using a subsequent sequence of all correct commands.

20. The memory device of claim 19, wherein, in the method, the commands are voltage signals having voltages that are on the order of normal operating voltages of the memory device.

21. The memory device of claim 19, wherein, in the method, a command is correct when the command matches a predetermined command.

22. An electronic system comprising:
a processor; and
a memory device comprising:
an array of memory cells; and
control circuitry coupled to the processor, wherein the control circuitry is configured to cause the memory device to perform a method of operation comprising:
enabling a test mode of the memory device in response to a command sequence received from the processor when all of the commands of the command sequence are correct; and
disabling the test mode upon receiving an incorrect command of the command sequence;
wherein the commands are voltage signals having voltages that are on the order of normal operating voltages of the integrated circuit device.

23. An electronic system comprising:
a processor; and
a memory device comprising:
an array of memory cells; and
control circuitry coupled to the processor and comprising a disable latch, wherein the control circuitry is configured to cause the memory device to perform a method of operation comprising:
enabling a test mode of the memory device in response to a sequence of commands when all of the commands of the sequence are correct;
setting the disable latch upon receiving an incorrect command to disable the test mode; and
requiring the memory device to power down and power back up to reset the latch to its initial state in order to enable the test mode using a subsequent sequence of all correct commands.

* * * * *